United States Patent [19]
Wong et al.

[11] Patent Number: 4,893,212
[45] Date of Patent: Jan. 9, 1990

[54] PROTECTION OF POWER INTEGRATED CIRCUITS AGAINST LOAD VOLTAGE SURGES

[75] Inventors: Stephen L. Wong, Scarsdale; Satyendranath Mukherjee, Yorktown Hts., both of N.Y.

[73] Assignee: North American Philips Corp., New York, N.Y.

[21] Appl. No.: 288,062

[22] Filed: Dec. 20, 1988

[51] Int. Cl.$^4$ .............................................. H02H 9/04
[52] U.S. Cl. ............................................ 361/91; 361/6; 361/8; 361/88; 361/187; 323/289; 363/56
[58] Field of Search ............... 307/100, 101, 544, 570; 323/269, 271, 289; 363/53, 56; 361/6, 8, 12, 86, 88, 90, 91, 92, 111, 154, 155, 156, 187, 189, 190, 152

[56] References Cited

U.S. PATENT DOCUMENTS

| | | | |
|---|---|---|---|
| 3,729,655 | 4/1973 | Gratzke | 363/56 X |
| 4,186,418 | 1/1980 | Seiler | 361/91 |
| 4,328,526 | 4/1982 | Dilger et al. | 361/154 |
| 4,503,480 | 3/1985 | Pickard et al. | 361/152 |
| 4,658,203 | 4/1987 | Freymuth | 361/91 X |
| 4,665,459 | 5/1987 | Bynum et al. | 361/91 |

FOREIGN PATENT DOCUMENTS 2638179  3/1978  Fed. Rep. of Germany ........ 361/91

Primary Examiner—A. D. Pellinen
Assistant Examiner—H. L. Williams
Attorney, Agent, or Firm—Steven R. Biren

[57] ABSTRACT

A power integrated-circuit device is protected against load voltage surges. This is done by providing an alternate current-carrying path that is activated only in response to the occurrence of such surges. This alternate path is independent of and separate from the connection that extends between the device and its power supply source. In addition, circuitry is connected to the device to limit the portion of the surge voltage that can appear across critical elements of the device.

7 Claims, 2 Drawing Sheets $$V_0 = -L \frac{dI}{dt} = -\frac{LI_0}{\Delta t}$$

4,893,212

PROTECTION OF POWER INTEGRATED CIRCUITS AGAINST LOAD VOLTAGE SURGES

BACKGROUND OF THE INVENTION

This invention relates to protecting integrated circuits and, more particularly, to protecting a power integrated circuit device from possible damage arising from the occurrence of voltage surges in a load connected to the device.

Power integrated circuit (PIC) devices (also referred to as smart-power devices) are utilized in a wide variety of industrial applications. In one such application, a PIC device is employed as a so-called high-side switch to connect a power supply to an associated load. In many cases of practical importance, the nature of the load is such that a disruption in the power supply or other similar malfunction will cause a relatively large voltage surge to appear across the load. The magnitude of this surge is often sufficient to irreversibly damage the PIC device and render it unsuitable for thereafter performing its intended function.

Accordingly, continuing efforts have been directed by workers skilled in the art aimed at trying to devise a simple and reliable arrangement for protecting a PIC device against load voltage surges. Prior art power integrated circuits with various protection schemes are shown in U.S. Pat. Nos. 4,489,341 and 4,521,795, European Patent Application EP 0 271 942 A2, and German Offenlegungsschrift DE 37 20 256A1. It was recognized that these efforts, if successful, would make these devices more attractive for utilization in important commercial applications where dependable long-lived operation is required.

SUMMARY OF THE INVENTION

In accordance with the principles of the present invention, a PIC device operated as a switch is protected against voltage surges that occur in a load connected thereto. This is done by providing an alternate circuit path that is activated only if a break or interruption occurs between the PIC device and its associated power supply. This alternate path is independent of and separate from the path that extends between the PIC device and the power supply. When activated, this alternate path supplies the requisite current to the load during the existence of the surge. In addition, a protection element and a limiting resistor are connected to the load and the PIC device to limit the value of the voltage that can appear across critical portions of the device.

In one specific illustrative embodiment of this invention, the PIC device to be protected comprises a metal-oxide-semiconductor (MOS) device and the load comprises an inductor connected between the source terminal of the MOS device and a point of reference potential such as ground. A power supply source is connected to the drain terminal of the MOS device. In this embodiment, the alternate current-carrying circuit path comprises a bipolar transistor having its base connected to the drain terminal of the MOS device, its emitter connected to the point of reference potential, and its collector connected to the source terminal of the MOS device. The protection element comprises a Zener diode connected between the gate and source terminals of the MOS device, and the limiting resistor is connected between the gate terminal and an input diode.

In the aforespecified illustrative embodiment of the present invention, all of the noted components except the load are advantageously fabricated in a single integrated-circuit chip. In this particular embodiment, a parasitic capacitance that inherently typically exists in the structure between the source and drain terminals of the MOS device is effective, when a potentially damaging voltage surge occurs across the inductor, to effect rapid turn-on of the alternate circuit path comprising the bipolar transistor. At the same time, the Zener diode and the limiting resistor are effective to limit the gate-to-source voltage of the MOS device to a value that is less than the breakdown voltage of the gate oxide of the device.

BRIEF DESCRIPTION OF THE DRAWING

A complete understanding of the present invention and of the above and other features and advantages thereof may be gained from a consideration of the following detailed description presented herein-below in connection with the accompanying drawing, not drawn to scale, in which.

DETAILED DESCRIPTION

Figure 1:
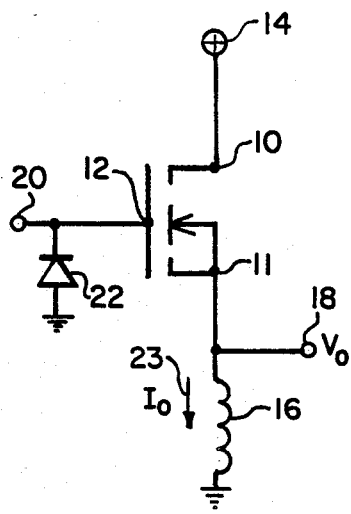
FIG. 1 is a schematic showing of a conventional high-side switch arrangement that includes an MOS device connected to an inductive load.

FIG. 1 shows a specific illustrative priorly known arrangement of the type to which the principles of the present invention are applicable. The illustrative arrangement comprises an MOS transistor switch that includes switch terminals 10,11 and control terminal 12. The upper switch terminal 10 is connected to a power supply source 14, while the lower switch terminal 11 is connected to a load that comprises, for example, an inductor 16. Further, the arrangement includes an output terminal 18 which is designated $V_o$.

The control terminal 12 shown in FIG. 1 is connected to an input terminal 20. Signals are applied to the terminal 20 from conventional associated driver circuitry (not shown) to control the ON-OFF state of the PIC switch. Diode 22 may comprise, for example, a part of the associated driver circuitry.

By way of providing a specific illustrative example, the PIC switch shown in FIG. 1 will be assumed herein to comprise a conventional MOS device. In that case, the switch terminals 10 and 11 constitute the drain and source terminals, and the control terminal 12 is the gate terminal, of the depicted device. When the MOS device is controlled to be in its ON state, a current designated $I_o$ flows from the source 14, through the drain-to-source path of the MOS device and through the load 16, as represented in FIG. 1 by arrow 23.

In practice, an arrangement of the type shown in FIG. 1 is useful in a variety of commercial applications.

In one such application, the depicted arrangement constitutes an electronically controlled switch for use in an automotive control system. In that case, the inductive load 16 comprises, for example, a solenoid included in the automotive system, and the power supply source 14 comprises the direct-current battery of the automobile.

Figure 2:
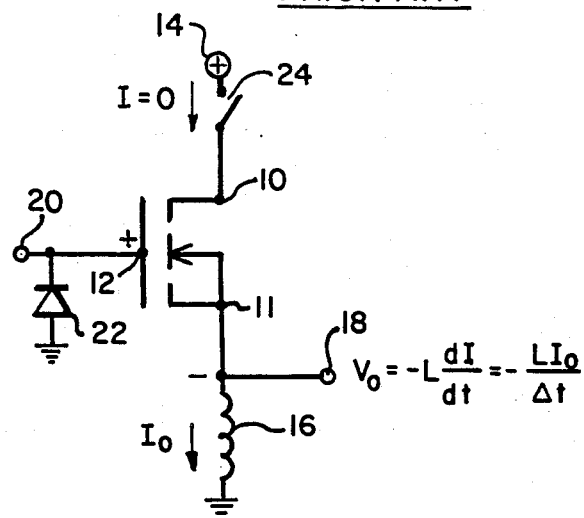
FIG. 2 represents the priorly known FIG. 1 arrangement at the moment a break occurs between the MOS device and its associated power supply source.

Assume, for example, that, during operation of the conventional arrangement shown in FIG. 1, the power supply source 14 is inadvertently disconnected from the drain terminal 10 of the MOS device. Such an occurrence, or any break in the line between the source 14 and the terminal 10, is schematically represented in FIG. 2 by an open switch 24. In response to such an occurrence, a transient voltage surge occurs across the inductive load 16. The nature of this surge is such that the output terminal 18 (and thus also the source terminal 11) is driven negative with respect to ground, as indicated in FIG. 2. The polarity of this voltage is such as to tend to maintain current flow through the inductor 16. In practice, the magnitude of this surge can be sufficient to establish a voltage between the gate terminal 12 and the source terminal 11 that exceeds the breakdown voltage of the gate oxide of the depicted MOS device. Such a breakdown of the gate oxide, or other surge-induced harm to the device such as damage to junctions therein, typically renders the device unsuitable thereafter for performing its intended switching function.

Figure 3:
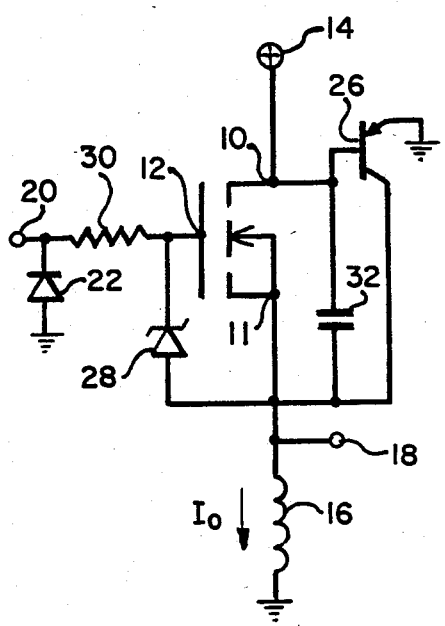
FIG. 3 is a schematic showing of the FIG. 1 arrangement modified to include specific illustrative protection circuitry made in accordance with the principles of the present invention.

In accordance with the principles of the present invention, a PIC switching arrangement of the type shown in FIGS. 1 and 2 is modified in a simple way to include reliable protection against load voltage surges. A specific such illustrative modified arrangement is schematically depicted in FIG. 3. Elements in FIG. 3 that correspond to those in FIGS. 1 and 2 are designated with the same respective reference numerals.

In the specific illustrative inventive embodiment of FIG. 3, an alternate path is provided to carry current through the load 16 in the event of a disruption in the connection between the upper switch terminal 10 and the power supply source 14. By providing such a current path, the magnitude of the voltage surge that appears across the load is decreased relative to what it would be if no current from another source were supplied thereto.

By way of example, the alternate current-carrying path shown in FIG. 3 comprises a bipolar transistor 26. For the particular illustrative embodiment represented in FIG. 3, the transistor 26 is a p-n-p device whose emitter is connected to ground, whose base is connected to the upper switch terminal 10 (and thus also to the source 14) and whose collector is connected to the lower switch terminal 11 and thus also to the load 16.

During normal operation, the base-to-emitter junction of the p-n-p transistor 26 shown in FIG. 3 is reverse-biased by the source 14 . Hence, the transistor 26 is thereby normally maintained in its OFF or non-conducting state and the depicted modified arrangement with its alternate current-carrying path operates in exactly the same way as does the conventional unmodified arrangement of FIGS. 1 and 2.

In further accordance with the principles of the present invention, the FIG. 3 arrangement also includes circuitry for limiting the voltage that can appear between the lower switch terminal 11 and the control terminal 12. Illustratively, this circuitry comprises a standard Zener diode 28 and a resistor 30. The value of the breakdown voltage of the diode 28 is selected to be less than the value that might cause damage to the PIC device if applied between the lower switch terminal 11 and the control terminal 12. For the particular illustrative case in which the PIC device comprises a MOS device, the breakdown voltage of the diode 28 is chosen to be less than the voltage that might cause breakdown of the oxide between the source (lower switch terminal 11) and gate (control terminal 12) of the depicted device.

During normal operation of the FIG. 3 arrangement, the Zener diode 28 is non-conducting and no direct current flows through the limiting resistor 30. Thus, the illustrative modified arrangement with its voltage-limiting circuitry operates in exactly the same way as does the standard unmodified arrangement of FIGS. 1 and 2.

Illustratively, the protection circuitry shown in FIG. 3 includes one additional element, namely, a capacitor 32. The capacitor 32 functions to aid in the rapid turn-on of the bipolar transistor 26 in the event of the occurrence of a fault condition. In some illustrative embodiments of the invention, the capacitor 32 comprises a parasitic element that is inherently already present in the structure of the PIC device. If it is not so present, the device can be fabricated to purposely include such a capacitor.

Assume now that a fault condition occurs in the FIG. 3 arrangement. In particular, assume that a break occurs in the connection between the drain or upper switch terminal 10 and the power supply source 14. Such a condition is represented in FIG. 4 by an open switch 33.

Figure 4:
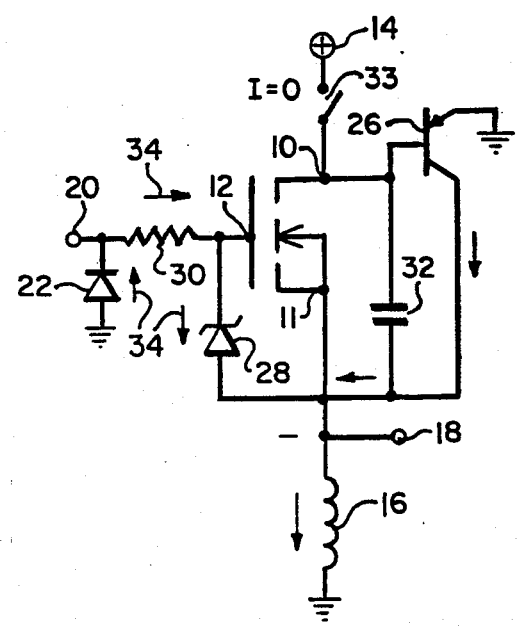
FIG. 4 represents the inventive FIG. 3 arrangement at the moment a break occurs between the MOS device and its associated power supply source.

When the assumed fault occurs, current flow ceases through the drain-to-source path of the PIC device shown in FIG. 4. At the same time, a negative voltage surge appears across the inductor 16. This negative voltage is coupled by the capacitor 32 and/or the MOS transistor channel between terminals 10 and 11 (if the switch had been ON) to the base of the transistor 26. In response thereto, the base-to-emitter junction of the transistor 26 is forward-biased and the transistor 26 is thereby activated (rendered conductive). As a result, current flows from ground, through the emitter-to-collector of the transistor 26 and through the inductor 16 to ground. This constitutes the alternate path that supplies current to the load during the occurrence of the assumed voltage surge.

At the same time, the Zener diode 28 and the resistor 30 shown in FIG. 4 insure that the portion of the voltage surge across the load 16 that appears between the gate terminal 12 and the source or lower switch terminal 11 does not exceed the gate-oxide breakdown voltage of the depicted PIC device.

In response to a load voltage surge of the type assumed above, current flows in FIG. 4, in the direction of arrows 34, from ground, through the diode 22, through the resistor 30, through the Zener diode 28 and through the load 16 to ground. A specified portion of the load voltage surge appears across the Zener diode 28. As indicated above, this specified portion is designed to be sufficiently small to insure that no damage occurs to the PIC device. The remainder of the surge voltage is dropped across the limiting resistor 30 (and also across the diode 22). The value of the resistor 30 is chosen to insure that the Zener diode 28 will maintain the gate-to-source voltage below the gate-oxide breakdown voltage of the depicted PIC device. In practice, the value of the resistor 30 is typically made as high as possible to achieve maximum protection but not so high as to give the arrangement an excessively high gate-delay characteristic. For each different embodiment of the invention, an appropriate practical value for the limiting resistor 30 is easily determined.

Figure 5A:
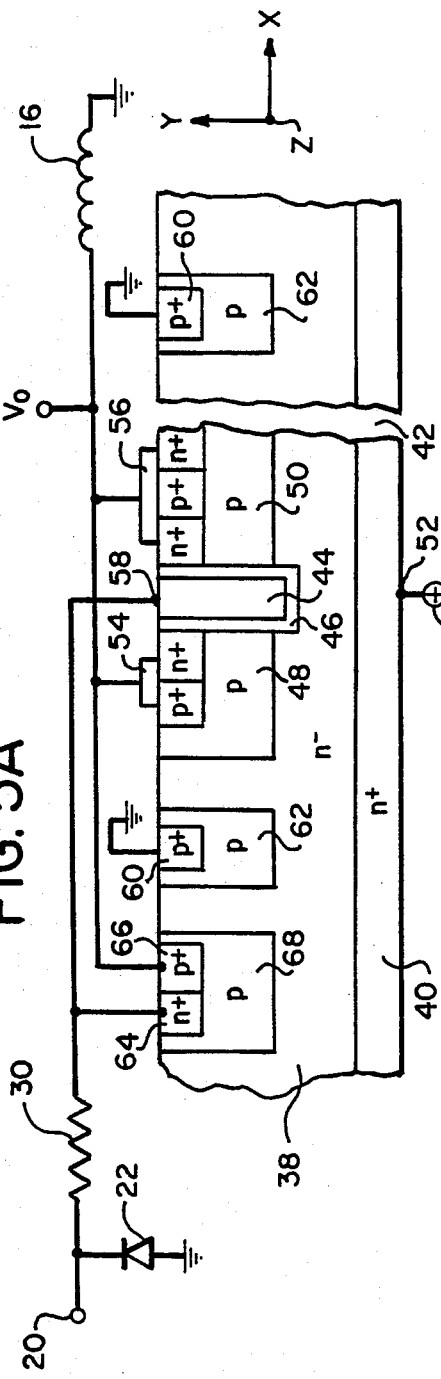
FIGS. 5A and 5B are each a cross-sectional representation of a portion of the inventive arrangement depicted in FIGS. 3 and 4 as embodied in a specific illustrative integrated-circuit chip.

FIG. 5A shows a portion of an integrated-circuit chip structure that constitutes a specific illustrative embodiment of the principles of the present invention. Although a variety of PIC devices are available for use as the switching element schematically shown in FIG. 3, the specific structural embodiment represented in FIG. 5A illustratively comprises a so-called trench MOS device. Also, although in FIG. 5A the previously specified diode 22 and resistor 30 are shown schematically for purposes of simplicity to be separate from the depicted integrated-circuit structure, it is apparent that these components can easily also if desired be incorporated into the same chip structure.

The structure shown in FIG. 5A includes, for example, an $n^-$-type silicon region 38 having an $n^+$-type layer 40 to which the power supply source 14 is connected. In practice, multiple identical individual MOS devices are advantageously formed in the depicted structure and interconnected in parallel to form a PIC device having the requisite power-handling capabilities, as is well known in the art. In FIG. 5A, only one such MOS device is explicitly shown but gap 42 in the structure is intended to indicate that the single MOS device actually shown is replicated in the structure many times.

The MOS device shown in FIG. 5A comprises a gate region 44 made, for example, of polysilicon and a silicon dioxide region 46 that forms the gate oxide of the device. By way of example, these regions constitute elongated regions that extend in the indicated Z direction.

The device of FIG. 5A further includes p-type regions 48,50 each having $p^+$-type and $n^+$-type regions formed therein. Further, contact 52 comprises the drain terminal, contacts 54,56 the source terminals and contact 58 the gate terminal of the illustrative MOS device.

In accordance with the principles of the present invention, additional regions are formed in the FIG. 5A structure to constitute the p-n-p transistor 26 and the Zener diode 28 shown in FIGS. 3 and 4. It is usually advantageous, but not necessary, that these additional regions that comprise portions of the protection circuitry be formed in the structure at the same time that corresponding regions are being formed in the MOS device itself.

In practice, $p^+$-type and p-type regions 60 and 62, respectively, are formed in the $n^-$-type region 38 of the FIG. 5A structure to form the emitter of the transistor 26. The already existing $n^-$-type region 38 and the $p^+$-type regions in the p-type regions 48,50 constitute the base and collector, respectively, of the transistor 26.

Illustratively, the $p^+$-type and p-type regions 60,62 shown in FIG. 5A advantageously comprise rings that are spaced apart from and encompass the entire periphery of the MOS device. Alternatively, these regions can constitute a row or rows that are spaced apart from only portions of the periphery of the MOS device. Either arrangement can in practice suffice to provide an adequate current-carrying path in the event of a load voltage surge.

In FIG. 5A, $n^+$-type and $p^+$-type regions 64 and 66 in p-type region 68 constitute the Zener diode 28 that is schematically shown in FIGS. 3 and 4. As indicated in FIG. 5A, the diode is connected between the gate terminal 58 and the source terminals 54,56.

In the FIG. 5A structure, the capacitor 32 of FIGS. 3 and 4 comprises the capacitance that exists between the p-type regions 48,50 and the $n^-$-type region 38. As shown in FIG. 5A, this capacitor is connected between the source terminals 54,56 and the $n^-$-type region which, as indicated above, comprises the base of the priorly specified p-n-p transistor.

Figure 5B:
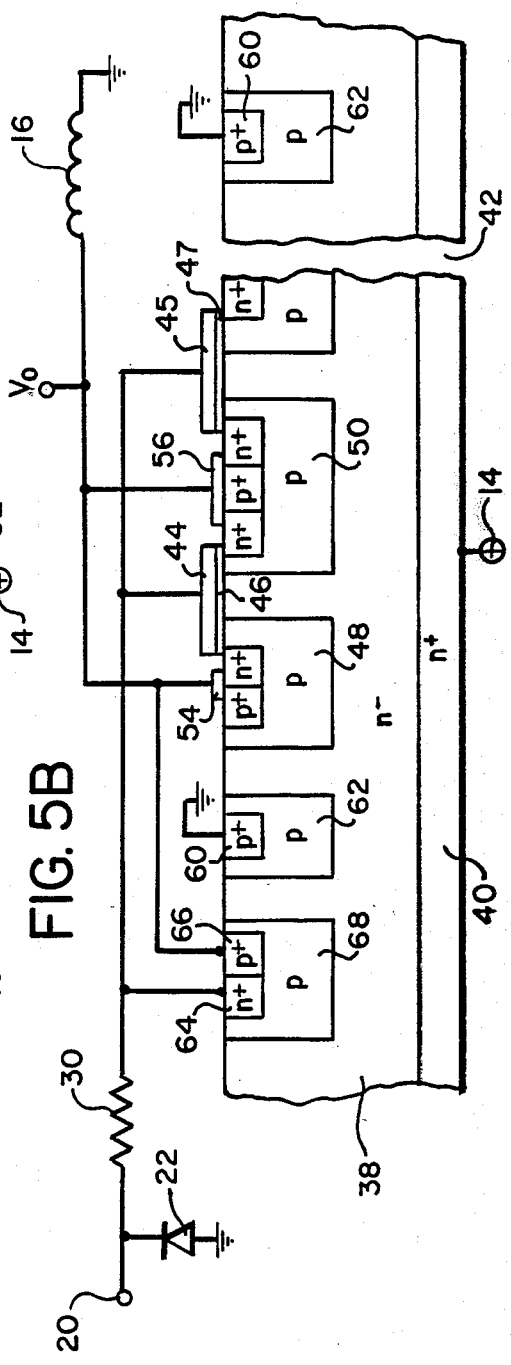

FIG. 5B represents another specific illustrative integrated-circuit chip structure (a vertical double-diffused MOS device) that embodies the principles of the present invention. Many of the elements of FIG. 5B are identical to corresponding elements shown in FIG. 5A and are accordingly designated with the same respective reference numerals.

In FIG. 5B, gate region 44 and additional gate region 45 of an adjacent MOS device are shown spaced apart from the top surface of the depicted semiconductor surface. Silicon dioxide regions 46 and 47 respectively underlie the gate regions 44 and 45.

Finally, it is to be understood that the above-described arrangements are only illustrative of the principles of the present invention. In accordance with these principles, numerous modifications and alternatives may be devised by those skilled in the art without departing from the spirit and scope of the invention. Thus, for example, although particular emphasis herein has been directed to MOS devices, it is to be understood that the principles of the invention are applicable to the protection of a variety of PIC devices (MOS or bipolar) made by various integrated-circuit fabrication technologies. Other alternatives, such as providing a fault-activated current-carrying path that comprises a structure other than the particular p-n-p transistor described above, are also clearly within the scope of the principles of the present invention. Additionally, the invention is applicable to circuit arrangements in which a load other than an inductor causes a voltage surge in response to an interruption in the associated power supply.

What is claimed is:

1. A circuit arrangement comprising
   a semiconductor switch having first and second switch terminals and a control terminal,
   means for directly connecting said first switch terminal to one terminal of a power supply source whose other terminal is connected to a point of reference potential such as ground,
   means for connecting said second switch terminal to one terminal of a two-terminal load device, the other terminal of said load device being connected to said point of reference potential,
   active means connected in parallel with said load device for providing an alternate current path for said load device only in response to the occurrence of a voltage surge across said load device, including a bipolar transistor having base, emitter and collector terminals, said emitter terminal being connected to said point of reference potential, said collector terminal being connected to said one terminal of said load device, and said base terminal being connected to said first switch terminal which is connected to said power supply source.
   and means connected to said control terminal and to said second switch terminal for limiting the voltage that can appear between said control terminal and said second switch terminal when a load voltage surge occurs.

2. An arrangement as in claim 1 wherein said switch comprises a metal-oxide-semiconductor device, and wherein said first and second switch terminals comprise the drain and source terminals of said metal-oxide-semiconductor device and said control terminal comprises the gate terminal of said metal-oxide-semiconductor device.

3. An arrangement as in claim 2 wherein said means for providing an alternate current path further includes a capacitor connected between the base terminal of said transistor and said one terminal of said load device.

4. An arrangement as in claim 3 wherein said means for limiting the voltage comprises a Zener diode connected between said gate terminal and the one of said drain and source terminals that is connected to said one terminal of said load device, and a limiting resistor connected between said gate terminal and an input terminal of said arrangement.

5. An arrangement as in claim 4 further including a diode connected between said input terminal and said point of reference potential.

6. An arrangement as in claim 5 wherein said switch comprises a trench metal-oxide-semiconductor transistor.

7. An arrangement as in claim 5 wherein said switch comprises a vertical double-diffused metal-oxide-semiconductor transistor.

* * * * *